United States Patent
Shin et al.

(10) Patent No.: US 9,190,423 B2
(45) Date of Patent: Nov. 17, 2015

(54) ARRAY SUBSTRATE FOR FRINGE FIELD SWITCHING MODE LIQUID CRYSTAL DISPLAY DEVICE AND METHOD FOR FABRICATING THE SAME

(71) Applicant: LG Display Co., Ltd., Seoul (KR)

(72) Inventors: DongSu Shin, Paju (KR); SeungKyu Choi, Paju (KR); CheolHwan Lee, Suwon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/479,151

(22) Filed: Sep. 5, 2014

(65) Prior Publication Data
US 2015/0001541 A1   Jan. 1, 2015

Related U.S. Application Data

(62) Division of application No. 13/679,643, filed on Nov. 16, 2012, now Pat. No. 8,852,975.

(30) Foreign Application Priority Data

Nov. 17, 2011  (KR) .................. 10-2011-0120367

(51) Int. Cl.
*H01L 29/04*  (2006.01)
*H01L 29/10*  (2006.01)
*H01L 31/00*  (2006.01)
*H01L 29/15*  (2006.01)
*H01L 27/14*  (2006.01)
(Continued)

(52) U.S. Cl.
CPC ............ *H01L 27/124* (2013.01); *G02F 1/1368* (2013.01); *G02F 1/134363* (2013.01); *H01L 27/1248* (2013.01); *H01L 29/6675* (2013.01); *H01L 29/786* (2013.01); *G02F 2001/134372* (2013.01)

(58) Field of Classification Search
USPC ....................................... 257/59, 72, E27.111
See application file for complete search history.

(56) References Cited

U.S. PATENT DOCUMENTS

2002/0159016 A1  10/2002  Nishida et al.
2003/0222838 A1  12/2003  Iida et al.
(Continued)

FOREIGN PATENT DOCUMENTS

CN   101644864 A   2/2010
JP   2002-329726 A   11/2002
(Continued)

*Primary Examiner* — Mary Wilczewski
*Assistant Examiner* — Erik T Peterson
(74) *Attorney, Agent, or Firm* — Birch, Stewart, Kolasch & Birch, LLP

(57) ABSTRACT

The present invention relates to an array substrate for a fringe field switching (FFS) mode liquid crystal display device and a method for fabricating the same. The liquid crystal display device may include a gate line formed on the substrate; a data line crossed with the gate line to define a pixel region; a thin-film transistor (TFT) formed at an intersection of the gate and data line; an organic insulating layer formed to have an opening portion for exposing the TFT; a common electrode having an area formed at an upper portion of the organic insulating layer, and an auxiliary electrode pattern connected to the TFT through the opening portion; a passivation layer formed to expose the auxiliary electrode pattern connected to the TFT; and pixel electrodes electrically connected to the TFT through the exposed auxiliary electrode pattern.

11 Claims, 11 Drawing Sheets

(51) Int. Cl.
*H01L 31/036* (2006.01)
*H01L 27/12* (2006.01)
*H01L 29/66* (2006.01)
*H01L 29/786* (2006.01)
*G02F 1/1368* (2006.01)
*G02F 1/1343* (2006.01)

(56) References Cited

U.S. PATENT DOCUMENTS

2010/0033664 A1 2/2010 Lee
2011/0080549 A1* 4/2011 Jung et al. ............... 349/141
2011/0157039 A1 6/2011 Shin et al.
2011/0222010 A1 9/2011 Lee et al.
2011/0255028 A1 10/2011 Nishizawa

FOREIGN PATENT DOCUMENTS

| | | |
|---|---|---|
| JP | 2003-344824 A | 12/2003 |
| JP | 2008-046655 A | 2/2008 |
| JP | 2010-079075 A | 4/2010 |
| JP | 2010-145457 A | 7/2010 |
| JP | 2011-227191 A | 11/2011 |
| TW | I292506 B | 1/2008 |

* cited by examiner

ARRAY SUBSTRATE FOR FRINGE FIELD SWITCHING MODE LIQUID CRYSTAL DISPLAY DEVICE AND METHOD FOR FABRICATING THE SAME

CROSS-REFERENCE TO RELATED APPLICATIONS

This application is a Divisional of U.S. patent application Ser. No. 13/679,643 filed on Nov. 16, 2012, which claims the benefit of Korean Patent Application No. 10-2011-0120367, filed on Nov. 17, 2011. The contents of all of these applications are hereby incorporated by reference as fully set forth herein in their entirety.

BACKGROUND OF THE INVENTION

1. Field of the Invention

The present invention relates to a liquid crystal display device, and more particularly, to an array substrate for a fringe field switching (FFS) mode liquid crystal display device and a method for fabricating the same.

2. Description of the Related Art

In general, the driving principle of a liquid crystal display device is based on optical anisotropy and polarization of liquid crystals. Liquid crystals having an elongated structure exhibit directivity in molecular arrangement, and thus the direction of their molecular arrangement can be controlled by artificially applying an electric field to liquid crystals.

Accordingly, if the molecular arrangement direction of liquid crystals is arbitrarily controlled, then the molecular arrangement of liquid crystals may be changed, and light is refracted in the molecular arrangement direction of liquid crystals by optical anisotropy to exhibit image information.

At present, an active matrix liquid crystal display device (AM-LCD; hereinafter, abbreviated as a "liquid crystal display device") in which thin-film transistors and pixel electrodes connected to the thin-film transistors are arranged in a matrix form have been widely used due to its resolution and video implementation capability.

The liquid crystal display device may include a color filter substrate (i.e., upper substrate) formed with common electrodes, an array substrate (i.e., lower substrate) formed with pixel electrodes, and liquid crystals filled between the upper and lower substrates, in which liquid crystals are driven by an electric field applied in the vertical direction between the common electrode and pixel electrode, thereby having excellent transmittance and aperture ratio.

However, the driving of liquid crystals by an electric field applied in the vertical direction has a drawback of providing insufficient viewing angle characteristics. Accordingly, a driving method of liquid crystals by in-plane switching has been newly proposed to overcome the foregoing drawback, and the driving method of liquid crystals by in-plane switching has excellent viewing angle characteristics.

Such an in-plane switching mode liquid crystal display device may include a color filter substrate and an array substrate facing each other, and a liquid crystal layer is interposed between the color filter substrate and the array substrate.

A thin-film transistor, a common electrode and pixel electrode are provided for a plurality of pixels, respectively, defined on a transparent insulating substrate on the array substrate.

Furthermore, the common electrode and pixel electrode are configured to be separated from each other in parallel on the same substrate.

In addition, the color filter substrate may include a black matrix at a portion corresponding to a gate line, data line, and a thin-film transistor on a transparent insulating substrate, and a color filter corresponding to the pixel.

Moreover, the liquid crystal layer is driven by a horizontal electric field between the common electrode and pixel electrode.

Here, the common electrode and pixel electrode are formed with a transparent electrode to secure brightness.

Accordingly, a fringe field switching (FFS) technique has been proposed to maximize the brightness enhancement effect. The FFS technique allows liquid crystals to be controlled in a precise manner, thereby obtaining high contrast ratio with no color shift.

A method of fabricating a fringe field switching (FFS) mode liquid crystal display device according to the related art will be described with reference to FIGS. 1 and 2.

FIG. 1 is a schematic plane view illustrating a fringe field switching (FFS) mode liquid crystal display device according to the related art.

FIG. 2 is a schematic cross-sectional view illustrating a fringe field switching (FFS) mode liquid crystal display device, as a cross-sectional view along the line II-II of FIG. 1.

An array substrate for a fringe field switching (FFS) mode liquid crystal display device according to the related art may include a plurality of gate lines 13 extended in one direction on a transparent insulating substrate 11 to be separated from one another in parallel; a plurality of data lines 21 crossed with the gate lines 13 to define pixel regions in the crossed areas; a thin-film transistor (T) provided at an intersection of the gate line 13 and the data line 21, and made of a gate electrode 13a extended from the gate line 13 in the vertical direction, a gate insulating layer 15, an active layer 17, an ohmic contact layer 19, a source electrode 21a and a drain electrode 21b; a second passivation layer 27 formed on a front surface of the substrate including the thin-film transistor (T); a pixel electrodes 29 having a large area formed on the first passivation layer 27 and connected to the thin-film transistor (T); a second passivation layer 31 formed on the first passivation layer 27 including the pixel electrode 29; and a plurality of pixel electrodes 37 formed on the passivation layer 35; a plurality of common electrodes 33 formed to be separated from one another on the second passivation layer 31 to correspond to the pixel electrodes 29, as illustrated in FIGS. 1 and 2.

Here, the pixel electrodes 29 having a large area are disposed in a pixel region in which the gate line 13 are data line 21 are crossed with each other.

Furthermore, the common electrode 33 is overlapped with the pixel electrode 29 by interposing the second passivation layer 31 therebetween. Here, the pixel electrode 29 and the plurality of common electrodes 33 are formed of Indium Tin Oxide (ITO) which is a transparent conductive material.

In addition, the pixel electrode 29 is electrically connected to the drain electrode 21b through a drain contact hole 27a formed on the first passivation layer 27.

Moreover, though not shown in the drawing, a color filter layer (not shown) and a black matrix (not shown) disposed between the color filter layers to block the transmission of light are deposited on a color filter substrate (not shown) bonded to the insulating substrate 11 formed with the pixel electrode 29 and a plurality of common electrodes 33, and an overcoat layer (not shown) may be formed on the black matrix and color filter layer to planarize between the black matrix and color filter layer.

Furthermore, though not shown in the drawing, a liquid crystal layer (not shown) may be formed between the color filter substrate (not shown) and the insulating substrate 11 bonded to each other.

As described above, according to a FFS mode liquid crystal display device in the related art, a drain contact hole should be formed to connect a pixel electrode and a drain electrode of the thin-film transistor to the passivation layer, and a liquid crystal disclination region hole is created at the circumference of the drain contact hole during the formation of the drain contact hole, thereby causing light leakage.

Accordingly, in the related art, in order to prevent light leakage caused by creating a liquid crystal disclination region at the circumference of the drain contact hole, the entire circumference portion of the drain contact hole should be covered by using a black matrix (BM), and thus an opening region thereof, namely, an area of the transmission region, may be reduced, thereby decreasing the transmittance of a pixel. In particular, the drain contact hole should be covered with a black matrix (BM) by taking a bonding margin into consideration as much as a distance to prevent light leakage caused by a disclination region of liquid crystals created by the drain contact hole, and thus the transmission region of a pixel may be reduced as much as the distance, thereby decreasing the transmittance to the extent.

Furthermore, it has a structure with no contact hole as well as a structure in which the common electrode is disposed at the uppermost portion, thereby causing a problem such as CT or horizontal line due to interference between data pixels.

Accordingly, in case of a structure in which the common electrode is disposed at the uppermost portion, it has a structure in which the pixel is located adjacent to the data line, thereby causing interference between the data line and pixel electrode.

SUMMARY OF THE INVENTION

The present invention is contrived to improve the foregoing problems, and an objective of the present invention is to provide a fringe field switching (FFS) mode liquid crystal display device and a method for fabricating the same capable of maximizing an opening region of the pixel without separately forming a drain contact hole for connecting a drain electrode to a pixel electrode in a fringe field switching (FFS) mode liquid crystal display device, thereby increasing the transmittance.

In order to accomplish the foregoing objective, there is provided an array substrate for a fringe field switching (FFS) mode liquid crystal display device, and the array substrate may include a gate line formed in one direction on a surface of the substrate; a data line crossed with the gate line to define a pixel region; a thin-film transistor formed at an intersection of the gate line and data line; an organic insulating layer formed on an entire surface of the substrate including the thin-film transistor to have an opening portion for exposing the thin-film transistor; a common electrode having a large area formed at an upper portion of the organic insulating layer, and an auxiliary electrode pattern connected to the thin-film transistor through the opening portion; a passivation layer formed on an entire surface of the substrate including the common electrode and auxiliary electrode pattern to expose the auxiliary electrode pattern connected to the thin-film transistor; and a plurality of pixel electrodes formed at an upper portion of the passivation layer, and electrically connected to the thin-film transistor through the exposed auxiliary electrode pattern, and overlapped with the common electrode.

In order to accomplish the foregoing objective, there is provided a method of fabricating an array substrate for a fringe field switching (FFS) mode liquid crystal display device, and the method may include forming a gate line in one direction on a surface of the substrate; forming a data line crossed with the gate line to define a pixel region; forming a thin-film transistor at an intersection of the gate line and data line; forming an organic insulating layer on an entire surface of the substrate including the thin-film transistor to have an opening portion for exposing the thin-film transistor; forming a common electrode having a large area at an upper portion of the organic insulating layer, and an auxiliary electrode pattern connected to the thin-film transistor through the opening portion; forming a passivation layer on an entire surface of the substrate including the common electrode and auxiliary electrode pattern to expose the auxiliary electrode pattern connected to the thin-film transistor; and forming a plurality of pixel electrodes and electrically connected to the thin-film transistor through the exposed auxiliary electrode pattern, and overlapped with the common electrode at an upper portion of the passivation layer.

According to an array substrate for a fringe field switching (FFS) mode liquid crystal display device and a method for fabricating the same in accordance with the present invention, a drain contact hole in the related art that has been formed to electrically connect a drain electrode to a pixel electrode is removed, and an opening portion for exposing an upper portion of the thin-film transistor is formed on an organic insulating layer such that the exposed thin-film transistor and the pixel electrode are electrically connected to each other in a direct manner, and thus an area that has been used to form a drain contact hole in the related art can be used for an opening area, thereby enhancing the transmittance compared to the related art.

Furthermore, according to an array substrate for a fringe field switching (FFS) mode liquid crystal display device and a method for fabricating the same in accordance with the present invention, a contact hole through which the drain electrode and pixel electrode are electrically connected to each other is formed within the opening portion provided at an upper portion of the thin-film transistor, and thus an area of the drain contact hole can be reduced, thereby increasing the aperture ratio.

As a result, it has a structure in which the pixel electrode is disposed at the uppermost portion, thereby reducing CT and horizontal line due to capacitance between the data line and pixel electrode.

Furthermore, according to an array substrate for a fringe field switching (FFS) mode liquid crystal display device and a method for fabricating the same in accordance with the present invention, an amorphous silicon layer (n+ or p+) and an amorphous silicon layer (a-Si:H) containing foreign substances below a conductive layer portion corresponding to the source electrode and drain electrode and the data line are simultaneously patterned, thereby removing a trouble of causing an active tail.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Hereinafter, an array substrate for a fringe field switching (FFS) mode liquid crystal display device and method for fabricating the same according to a preferred embodiment of the present invention will be described in detail with reference to the accompanying drawings.

Figure 1:
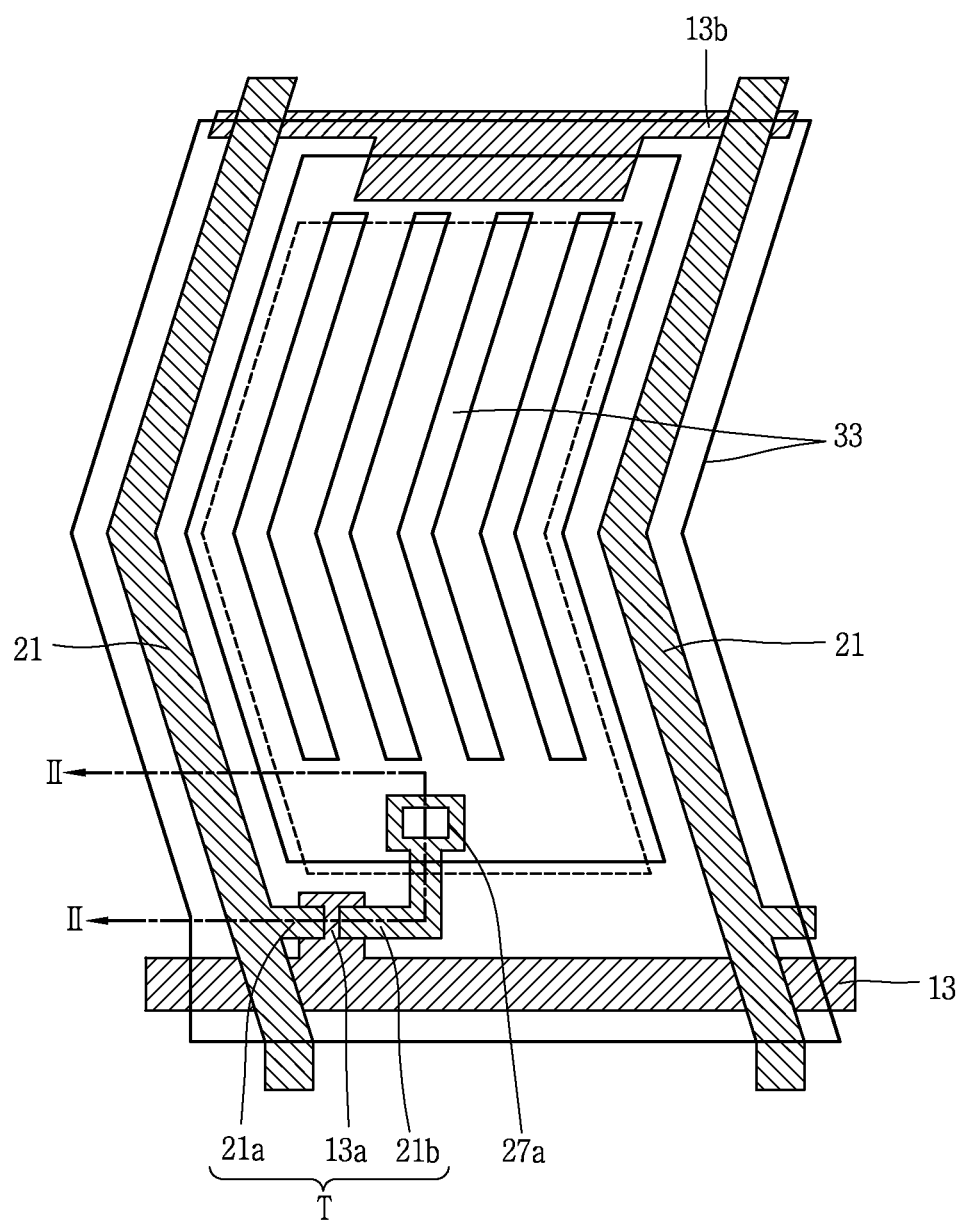
FIG. 1 is a schematic plan view illustrating a fringe field switching (FFS) mode liquid crystal display device according to the related art.
Figure 2:
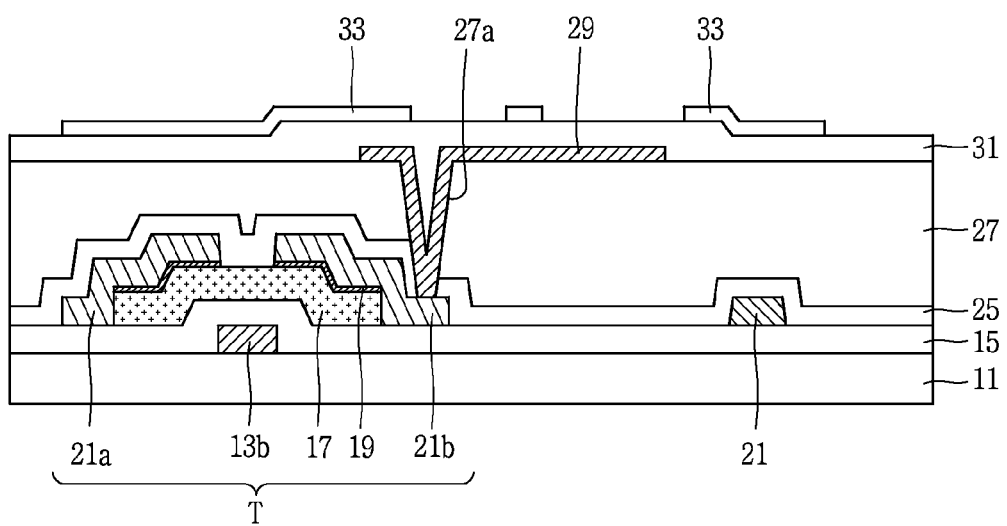
FIG. 2 is a schematic cross-sectional view illustrating a fringe field switching (FFS) mode liquid crystal display device according to the related art, as a cross-sectional view along the line II-II of FIG. 1.
Figure 3:
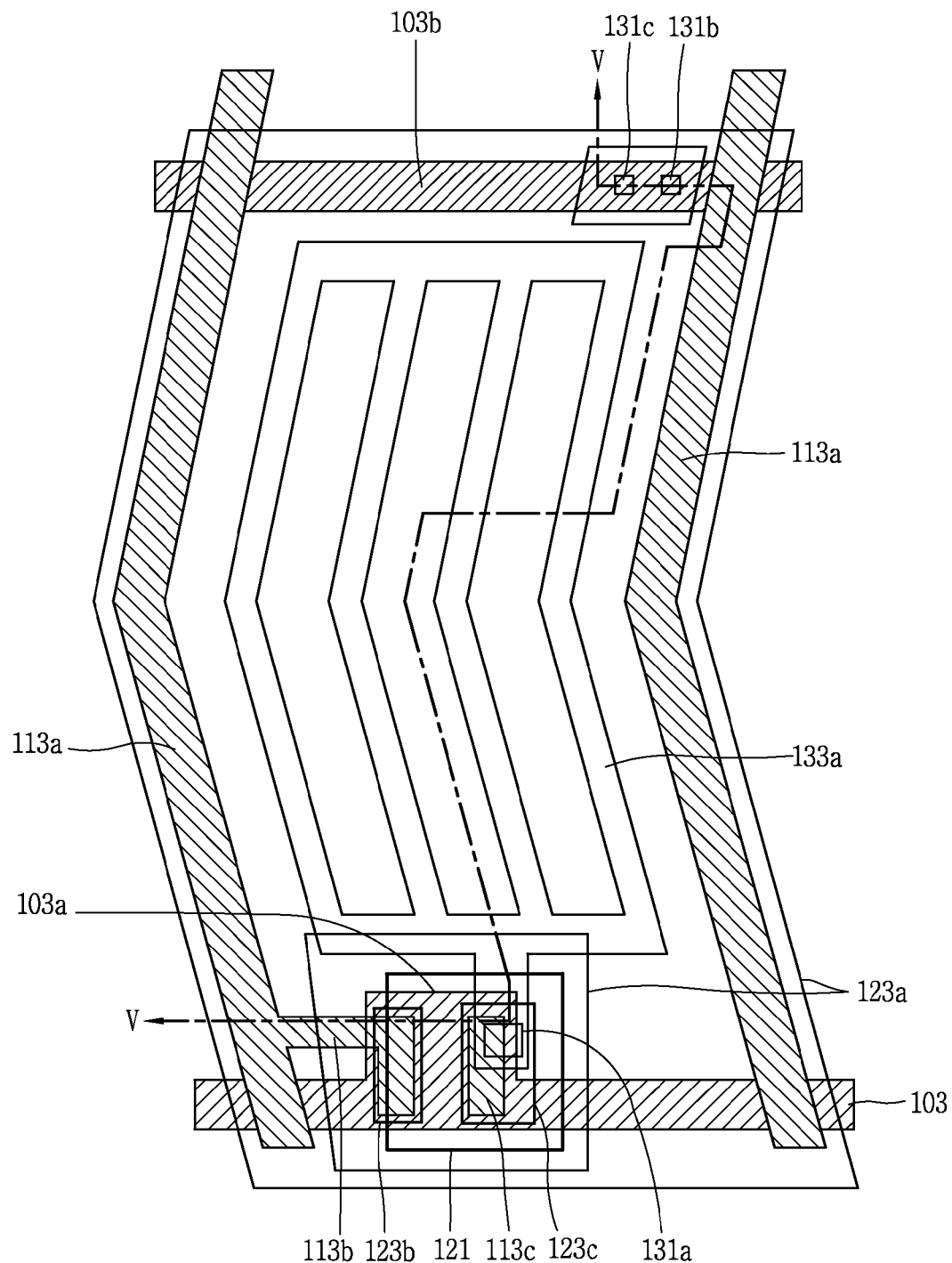
FIG. 3 is a schematic plan view illustrating a fringe field switching (FFS) mode liquid crystal display device according to the present invention.

FIG. 3 is a schematic plan view illustrating a fringe field switching (FFS) mode liquid crystal display device according to the present invention.

Figure 4:
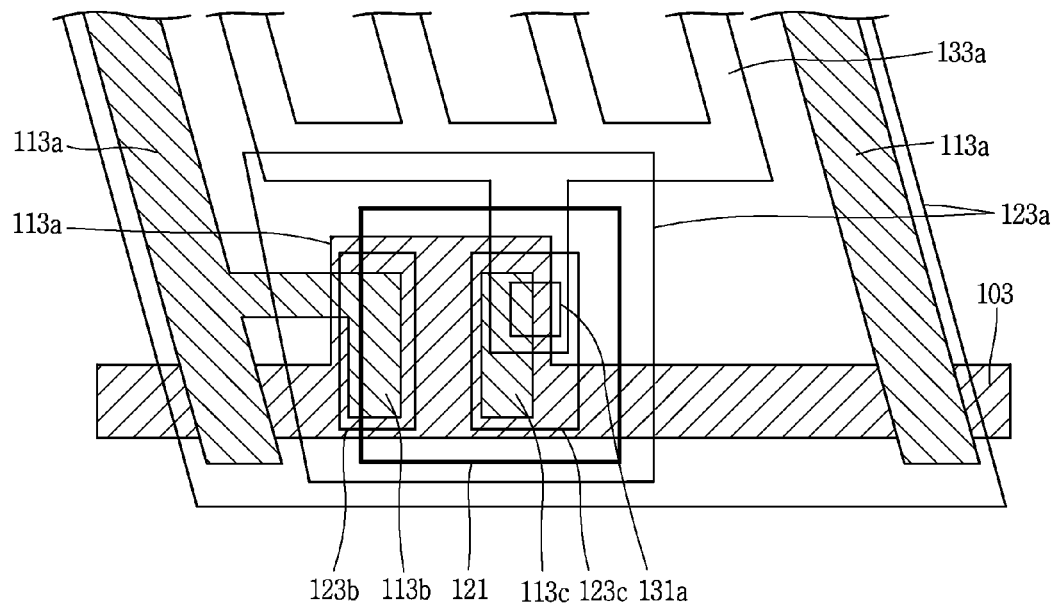
FIG. 4 is an enlarged plan view illustrating a thin-film transistor portion in a fringe field switching (FFS) mode liquid crystal display device according to the present invention.

FIG. 4 is an enlarged plan view illustrating a thin-film transistor portion in a fringe field switching (FFS) mode liquid crystal display device according to the present invention.

Figure 5:
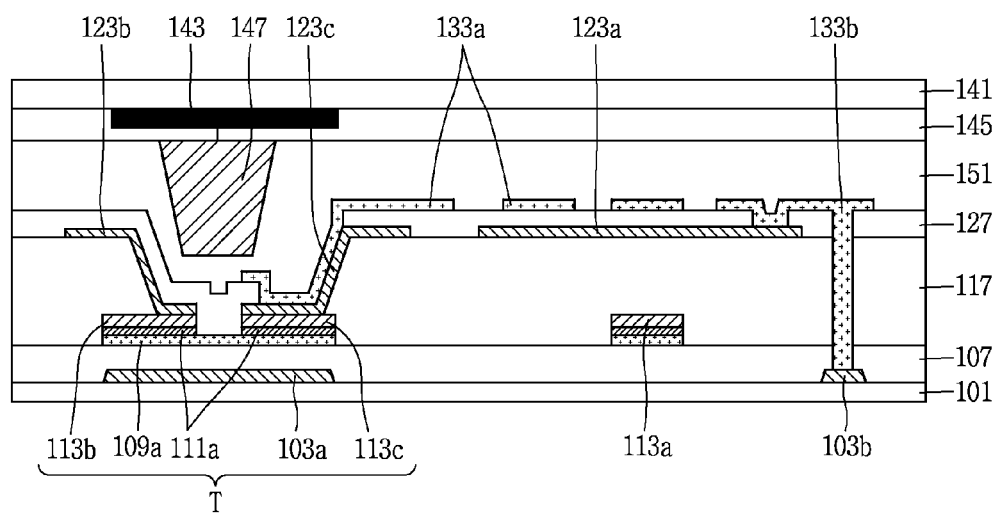
FIG. 5 is a schematic cross-sectional view illustrating a fringe field switching (FFS) mode liquid crystal display device according to the present invention, as a cross-sectional view along the line V-V of FIG. 4.

FIG. 5 is a schematic cross-sectional view illustrating a fringe field switching (FFS) mode liquid crystal display device according to the present invention, as a cross-sectional view along the line V-V of FIG. 4.

A fringe field switching (FFS) mode liquid crystal display device according to an embodiment of the present invention, as illustrated in FIGS. 3 through 5, may include a gate line 103 formed in one direction on a surface of the transparent insulating substrate 101; a common line 103b disposed to be separated from the gate line 103; a data line 113a crossed with the gate line 103 to define a pixel region; a thin-film transistor (T) formed at an intersection of the gate line 103 and data line 113a; an organic insulating layer 117 formed on an entire surface of the substrate including the thin-film transistor (T) to have an opening portion 121 for exposing the thin-film transistor (T); a common electrode 123a having a large area formed at an upper portion of the organic insulating layer 117, and an auxiliary electrode pattern 123b connected to the thin-film transistor (T) through the opening portion 121; a passivation layer 127 formed on an entire surface of the substrate including the common electrode 123a and auxiliary electrode pattern 123b to expose the auxiliary electrode pattern 123c connected to the thin-film transistor (T); and a plurality of pixel electrodes 133a formed at an upper portion of the passivation layer 127, and electrically connected to the thin-film transistor (T) through the exposed auxiliary electrode pattern 123c, and overlapped with the common electrode 123a.

Here, the common electrode 123a is disposed on an entire surface of the pixel region in which the gate line 103 and data line 113a are crossed with each other, and a plurality of transparent rod-shaped pixel electrodes 133a separated from one another are disposed at an upper side of the pixel electrode 133a by interposing the passivation layer 127 therebetween. Here, the common electrode 123a is electrically connected to the common line 103b disposed in parallel with the gate line 103 through a common line connection pattern 133b formed during the formation of the pixel electrode 133a.

Furthermore, as illustrated in FIG. 5, the pixel electrode 133a is connected to the auxiliary electrode pattern 123c directly connected to a drain electrode 113c through an opening portion 121 located at an upper portion of the thin-film transistor (T) without having a separate drain contact hole. Here, the opening portion 121 is formed to expose the source electrode 113b and drain electrode 113c constituting the thin-film transistor (T).

Furthermore, a black matrix 143 for blocking light on the upper substrate 141 corresponding to a region excluding the pixel region in which the gate line and data line are crossed with each other, and a color filter layer 145 including a red color filter layer (not shown), a green color filter layer (not shown) and a blue color filter layer (not shown) is formed between the black matrices 143. Here, the color filter layer 145 may be applied with a Color filter On TFT (COT) structure formed on the insulating substrate 101 instead of the upper substrate 141. In other words, the color filter layer 145 may be formed in the pixel region of the insulating substrate 101 in which the gate line 103 and data line 113a are crossed with each other.

Moreover, a column spacer 147 is formed at an upper portion of the color filter layer 145 to maintain a predetermined cell gap of the liquid crystal display device. Here, the column spacer 147 may be formed at an upper portion of the insulating substrate 101.

Accordingly, in case of the present invention, as illustrated in FIG. 5, the drain contact hole that has been formed in the prior art is removed, and thus the area of a region in which the drain contact hole is removed may be used for an opening region, thereby enhancing the transmittance to the extent.

In addition, a liquid crystal layer 151 may be formed between the insulating substrate 101 and upper substrate 141 to configure a fringe field switching (FFS) mode liquid crystal display device according to the present invention.

Through the foregoing configuration, the plurality of common electrodes 123a supply a reference voltage for driving liquid crystals, namely, a common voltage, to each pixel.

The plurality of common electrodes 123a are overlapped with the pixel electrode 133a having a large area by interposing the passivation layer 127 therebetween at each pixel region to form a fringe field.

In this manner, if a data signal is supplied to the pixel electrode 133a through the thin-film transistor (T), then the common electrode 123a supplied by a common voltage forms a fringe field so that liquid crystal molecules aligned in a horizontal direction between the insulating substrate 101 and the color filter substrate 141 are rotated by dielectric anisotropy, and thus the light transmittance of liquid crystal molecules passing through a pixel region varies according to the rotational degree, thereby implementing gradation.

According to an array substrate for a fringe field switching (FFS) mode liquid crystal display device in accordance with the present invention, a drain contact hole in the related art that has been formed to electrically connect a drain electrode to a pixel electrode is removed, and an opening portion for exposing an upper portion of the thin-film transistor is formed on a passivation layer such that the exposed thin-film transistor and the pixel electrode are electrically connected to each other in a direct manner, and thus an area that has been used to form a drain contact hole in the related art can be used for an opening area, thereby enhancing the transmittance compared to the related art.

Furthermore, an array substrate for a fringe field switching (FFS) mode liquid crystal display device in accordance with the present invention has a structure in which the pixel electrode is disposed at the uppermost portion, thereby reducing CT and horizontal line due to capacitance between the data line and pixel electrode.

Furthermore, according to an array substrate for a fringe field switching (FFS) mode liquid crystal display device in accordance with the present invention, an amorphous silicon layer (n+ or p+) and an amorphous silicon layer (a-Si:H) containing foreign substances below a conductive layer portion corresponding to the source electrode and drain electrode and the data line are simultaneously patterned, thereby removing a trouble of causing an active tail.

On the other hand, a method of fabricating an array substrate for a fringe field switching (FFS) mode liquid crystal display device having the foregoing configuration according to the present invention will be described below with reference to FIGS. 6A through 6Q.

Figure 6A:
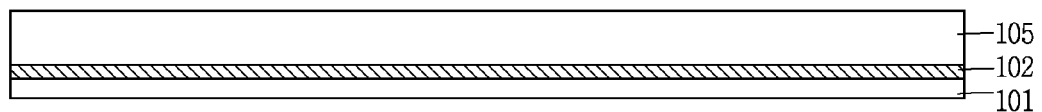
FIGS. 6A through 6Q are fabrication process cross-sectional views illustrating an array substrate for a fringe field switching (FFS) mode liquid crystal display device according to the present invention.
Figure 6B:
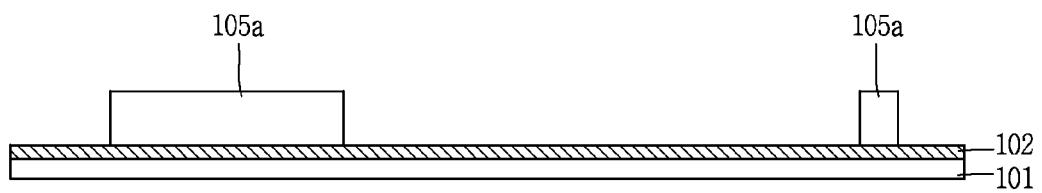
Figure 6C:
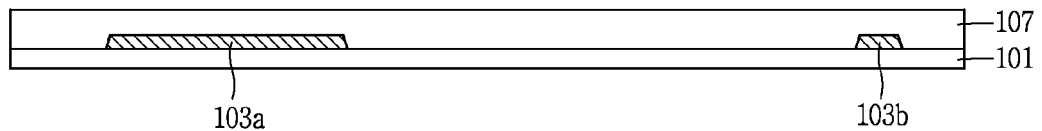
Figure 6D:
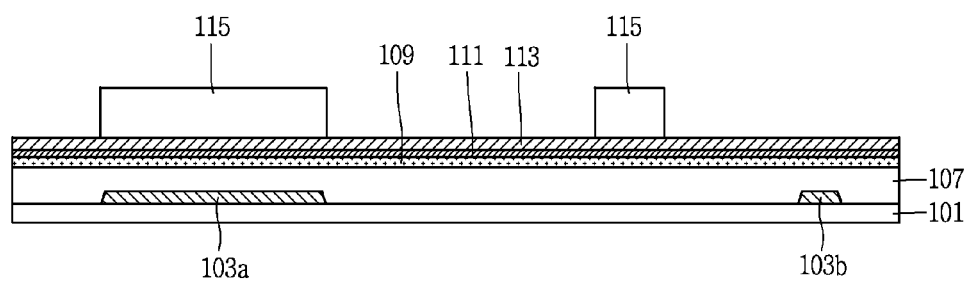
Figure 6E:
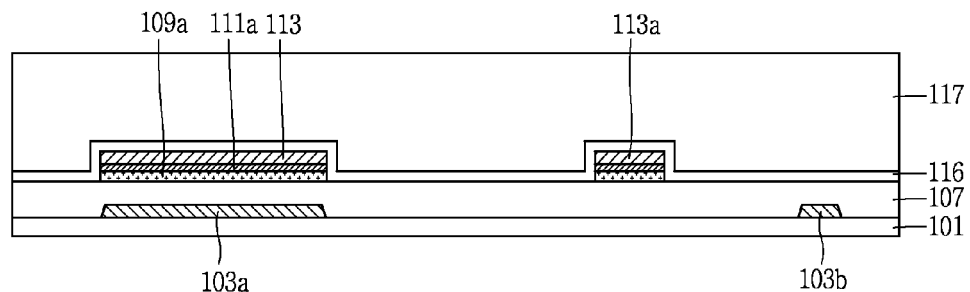
Figure 6F:
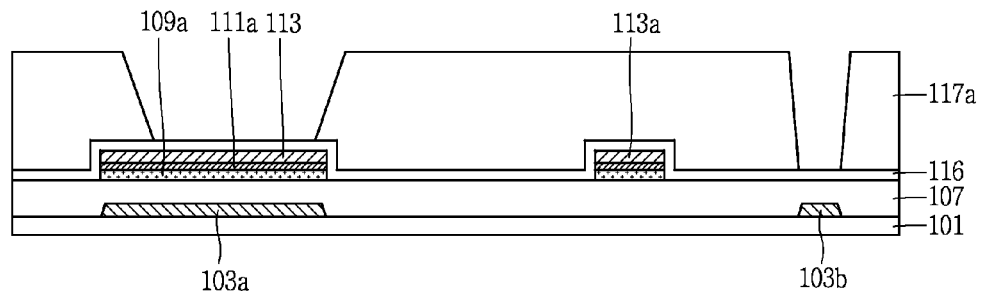
Figure 6G:
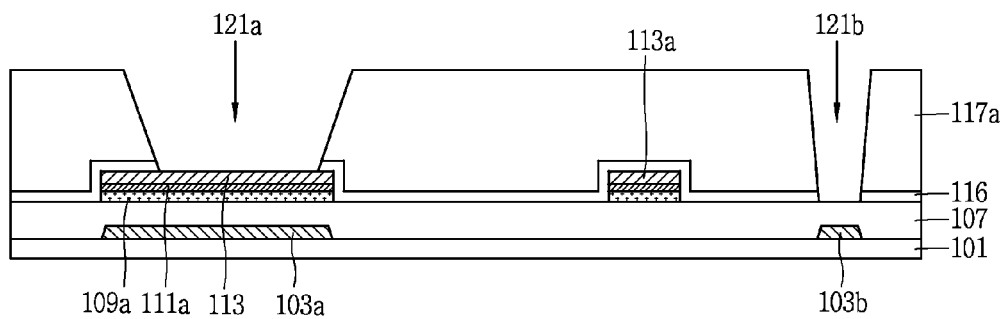
Figure 6H:
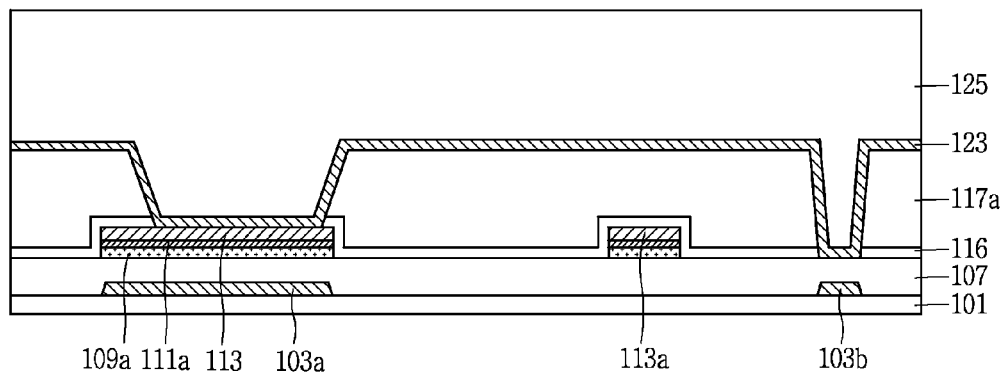
Figure 6I:
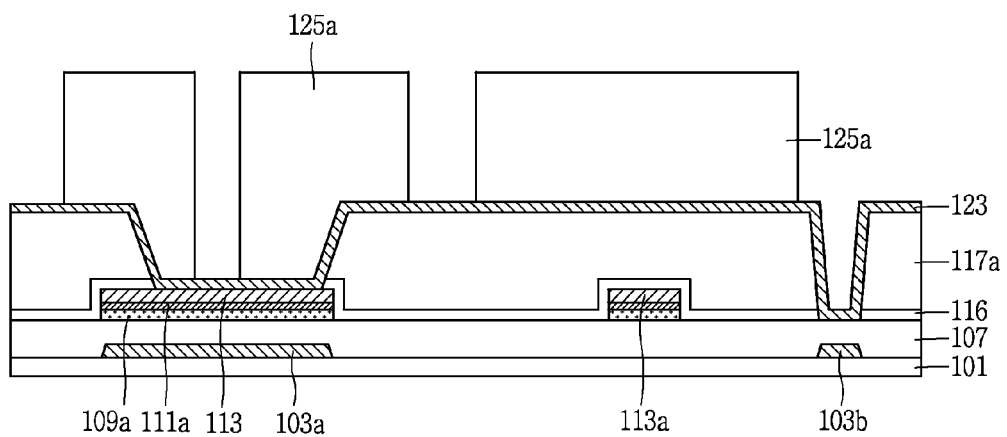
Figure 6J:
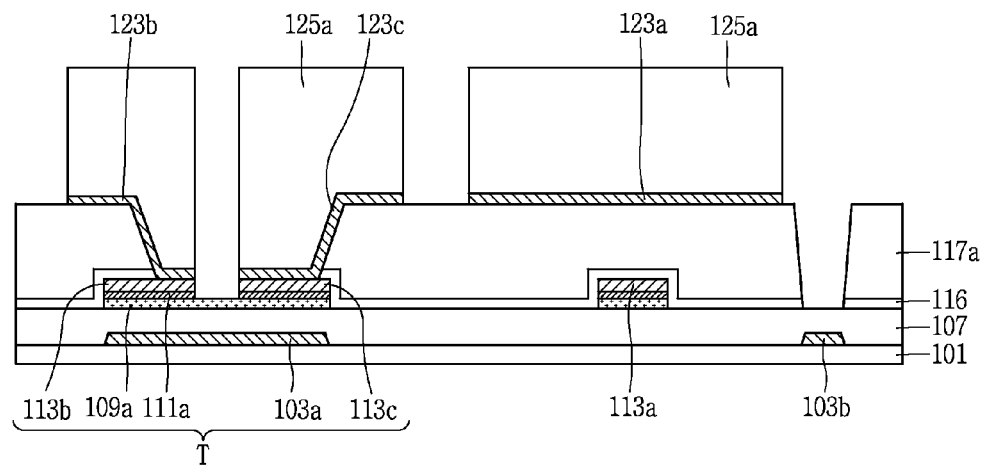
Figure 6K:
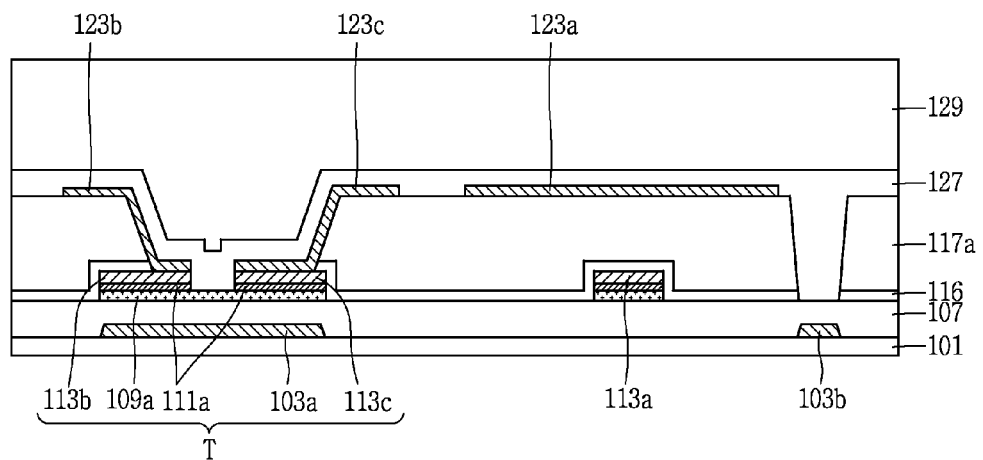
Figure 6L:
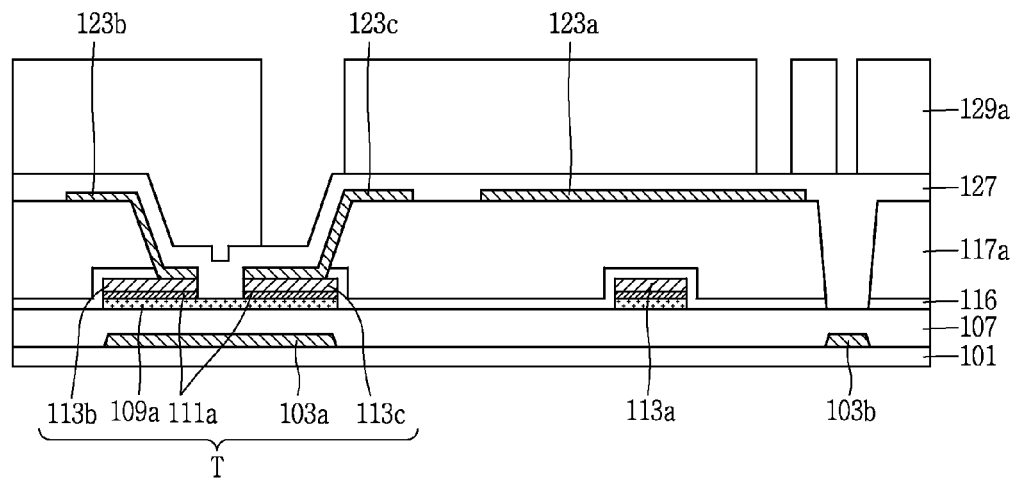
Figure 6M:
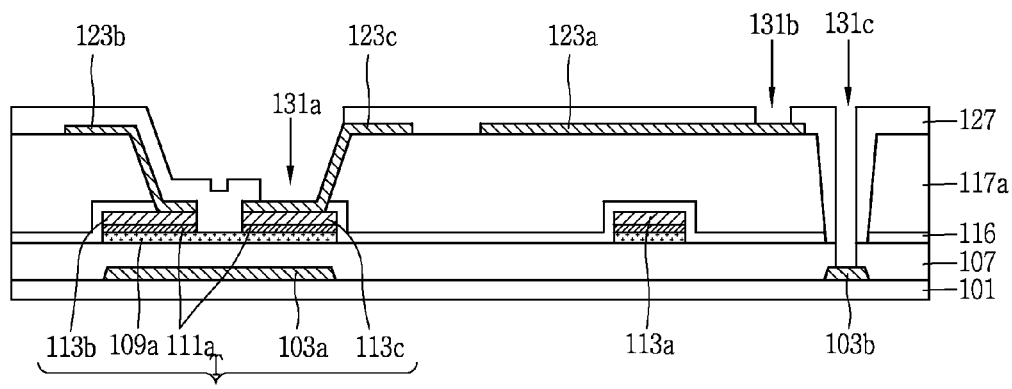
Figure 6N:
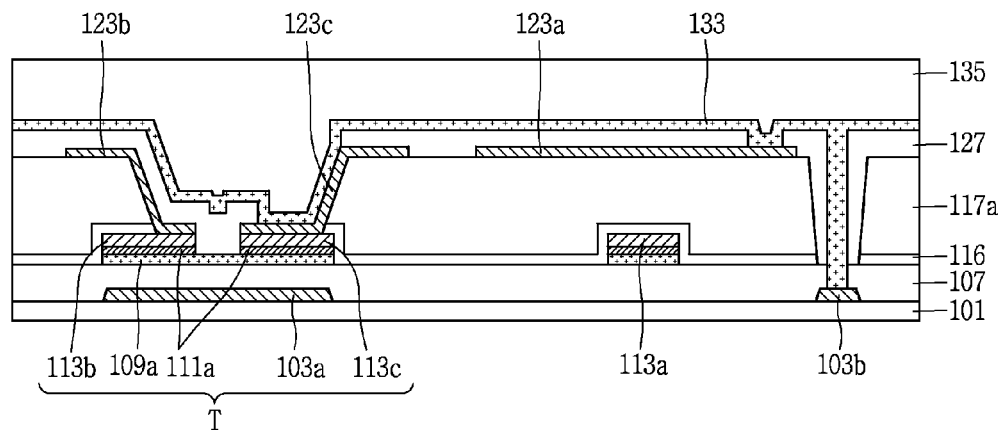
Figure 6O:
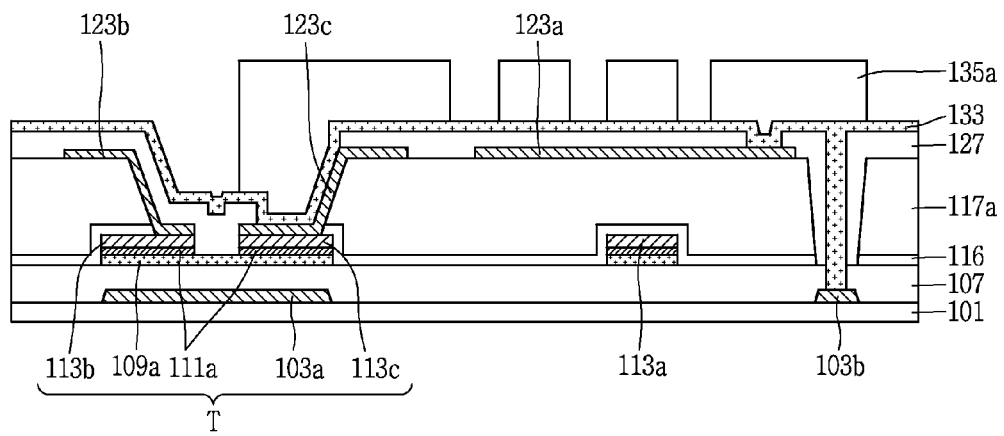
Figure 6P:
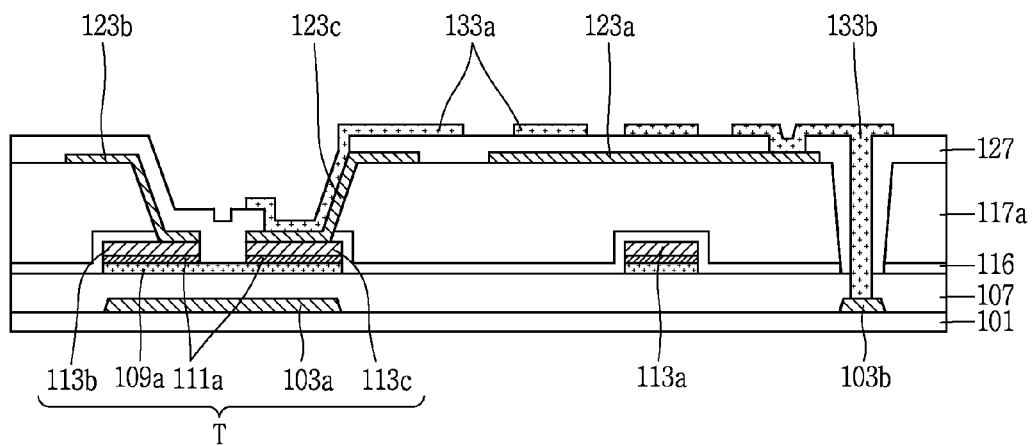
Figure 6Q:
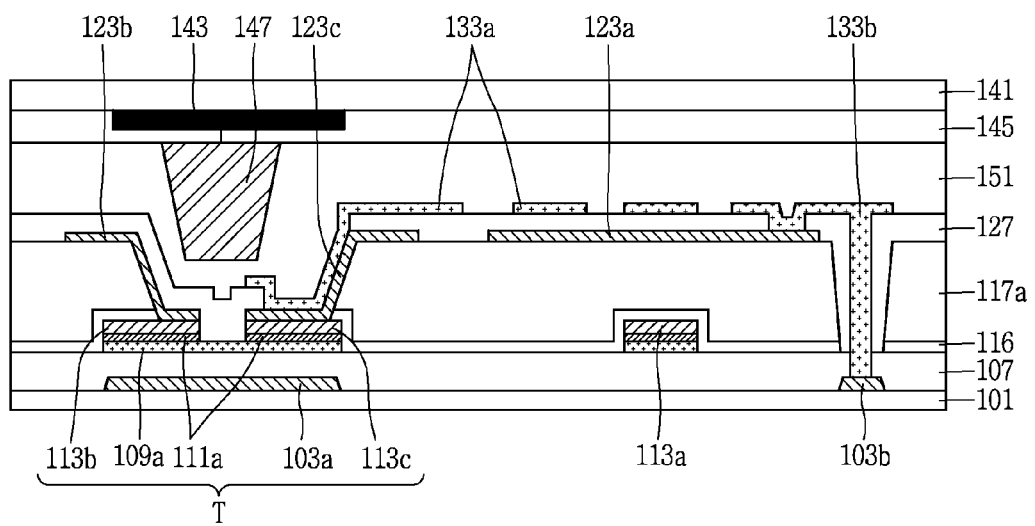

FIGS. 6A through 6Q are fabrication process cross-sectional views illustrating an array substrate for a fringe field switching (FFS) mode liquid crystal display device according to the present invention.

As illustrated in FIG. 6A, a plurality of pixel regions including a switching function are defined on a transparent insulating substrate 101, and a first conductive metal layer 102 is deposited on the transparent insulating substrate 101 by a sputtering method. In this case, at least one selected from the group consisting of aluminium (Al), tungsten (W), copper (Cu), molybdenum (Mo), chromium (Cr), titanium (Ti), moly-tungsten (MoW), moly-titanium (MoTi), copper/moly-titanium (Cu/MoTi) may be used for a target material for forming the first conductive metal layer 102. In this case, the first conductive metal layer 102 may be formed with a structure having at least one layer.

Next, a photoresist having a high transmittance is deposited at an upper portion of the first conductive metal layer 102 to form a first photosensitive layer 105.

Subsequently, as illustrated in FIG. 6B, an exposure process is carried out on the first photosensitive layer 105 through a photolithography process technology using an exposure mask (not shown), and then the first photosensitive layer 105 is selectively removed through a development process to form a first photosensitive pattern 105a.

Next, as illustrated in FIG. 6C, the first conductive metal layer 102 is selectively etched by using the first photosensitive pattern 105a as a blocking layer to form a gate line 103 (refer to FIG. 3), a gate electrode 103a extended from the gate line 103, and a common line 103b separated from and in parallel with the gate line 103 at the same time.

Subsequently, the first photosensitive pattern 105a is removed, and then a gate insulating layer 107 made of silicon nitride (SiNx) or silicon oxide (SiO$_2$) is formed on an entire surface of the substrate including the gate electrode 103a.

Next, as illustrated in FIG. 6D, amorphous silicon layer (a-Si:H) 109 and amorphous silicon layer (n+ or p+) 111 containing impurities are sequentially deposited on the gate insulating layer 107. At this time, the amorphous silicon layer (a-Si:H) 109 and amorphous silicon layer (n+ or p+) 111 containing impurities are deposited using a Chemical Vapour Deposition (CVD) method. At this time, an oxide-based semiconductor material such as IGZO instead of amorphous silicon layer (a-Si:H) 109 may be formed on the gate insulating layer 107.

Subsequently, a second conductive metal layer 113 is deposited on an entire surface of the substrate including the amorphous silicon layer (n+ or p+) 111 containing impurities using a sputtering method. At this time, at least one selected from the group consisting of aluminium (Al), tungsten (W), copper (Cu), molybdenum (Mo), chromium (Cr), titanium (Ti), moly-tungsten (MoW), moly-titanium (MoTi), copper/moly-titanium (Cu/MoTi) may be used for a target material for forming the second conductive metal layer 113.

Subsequently, though not shown in the drawing, a photoresist having a high transmittance is deposited at an upper portion of the second conductive metal layer 113 to form a second photosensitive layer (not shown).

Next, an exposure process is carried out on the second photosensitive layer (not shown) through a photolithography process technology using an exposure mask (not shown), and then the second photosensitive layer (not shown) is selectively removed through a development process to form a second photosensitive pattern 115.

Subsequently, as illustrated in FIG. 6E, the second conductive layer 113 is selectively etched by using the second photosensitive pattern 115 as an etching mask to define a source electrode and drain electrode formation region (not shown) together with the data line 113a crossed with the gate line 103 in a vertical direction.

Next, subsequently, a portion of the second conductive layer 113 corresponding to the source electrode and drain electrode formation region (not shown) and the amorphous silicon layer (n+ or p+) 111 containing impurities and amorphous silicon layer (a-Si:H) 109 below the data line 113a are sequentially etched through an etching process to form an ohmic contact layer 111a and an active layer 109a. At this time, a portion of the second conductive layer 113 corresponding to the source electrode and drain electrode formation region (not shown) and the amorphous silicon layer (n+ or p+) 111 containing impurities and amorphous silicon layer (a-Si:H) 109 below the data line 113a are patterned at the same time, thereby removing a trouble of causing an active tail.

Subsequently, as illustrated in FIG. 6E, a first passivation layer 116 and an organic insulating layer 117 are sequentially deposited on an entire surface of the substrate including the active layer 109a and ohmic contact layer 111a, a portion of the second conductive metal layer 113 corresponding to the source electrode and drain electrode formation region (not shown) and data line 113a. At this time, an inorganic insulating material made of silicon nitride (SiNx) or silicon oxide (SiO$_2$) is deposited for the first passivation layer 116. Furthermore, a photo acryl material or other photosensitive organic insulating materials exhibiting photosensitivity may be used for the organic insulating layer 117. Furthermore, since the photo acryl exhibits photosensitivity, an exposure process can be carried out without forming a separate photoresist during the exposure process. At this time, an inorganic insulating material may be used instead of the organic insulating layer 117.

Next, as illustrated in FIG. 6F, an exposure process is carried out on the organic insulating layer 117 through a photolithography process technology using an exposure mask (not shown), and then the organic insulating layer 117 is selectively removed through a development process to form an organic insulating layer pattern 117a for exposing an upper portion of the second metal conductive layer 113 and an upper portion of the common line 103b corresponding to the source electrode and drain electrode formation region (not shown).

Subsequently, as illustrated in FIG. 6G, a portion of the first passivation layer 116 disposed at an upper portion of the second metal conductive layer 113 and an upper portion of the common line 103b corresponding to the source electrode and drain electrode formation region (not shown) is selectively etched using the organic insulating layer pattern 117a as an etching mask to form a first opening portion 121a and a second opening portion 121b. At this time, a thin-film transistor (T) formation portion, namely, the source electrode and drain electrode formation region is exposed to the outside through the first opening portion 121a. Furthermore, the common line 103b is exposed to the outside through the second opening portion 121b.

Next, as illustrated in FIG. 6H, a transparent conductive material is deposited at an upper portion of the organic insulating layer 117 including the first and the second opening portion 121a, 121b using a sputtering method to form a first transparent conductive material layer 123. At this time, any one composition target selected from a transparent conductive material group including Indium Tin Oxide (ITO), Indium Zinc Oxide (IZO), and the like is used for the transparent conductive material. Furthermore, the first transparent conductive material layer 123 is directly brought into contact with a surface of the conductive layer 113 corresponding to the source electrode and drain electrode formation region (not shown).

Next, a photoresist having a high transmittance is deposited at an upper portion of the first transparent conductive material layer 123 to form a third photosensitive layer 125.

Next, as illustrated in FIG. 6I, an exposure process is carried out through a photolithography process technology using an exposure mask (not shown), and then the exposed third photosensitive layer 125 is selectively removed to form a third photosensitive pattern 125a. At this time, an upper surface of the first transparent conductive material layer 123 at an upper portion of the channel region of the thin-film transistor is exposed to the outside.

Subsequently, as illustrated in FIG. 6J, the exposed first transparent conductive material layer 123, the second conductive metal layer 113 thereunder and the ohmic contact layer 111a are sequentially etched using the third photosensitive pattern 125a as an etching mask, thereby forming the source electrode 113b and drain electrode 113c separated from each other while at the same time forming the common electrode 123a having a large area, a dummy pattern 123b and an auxiliary electrode pattern 123c. At this time, the ohmic contact layer 111a may be also etched and separated therefrom, and thus a channel region (not shown) of the active layer 109a located at a lower portion thereof is exposed to the outside. Furthermore, the auxiliary electrode pattern 123c is directly connected to the drain electrode 113c, and the dummy pattern 123b is directly connected to the source electrode 113b. At this time, the dummy pattern 123b is connected to only the source electrode 113b, and thus a separate etching is not required.

Next, as illustrated in FIG. 6K, the third photosensitive pattern 125a is removed, and then an inorganic insulating material or organic insulating material is deposited on an entire surface of the substrate to form a second passivation layer 127, and then a photoresist having a high transmittance is coated at an upper portion of the second passivation layer 127 to form a fourth photosensitive layer 129.

Subsequently, as illustrated in FIG. 6L, an exposure and development process is carried out by a photolithography process technology using an exposure mask (not shown) to remove the fourth photosensitive layer 129 to form a fourth photosensitive layer pattern 129a.

Next, as illustrated in FIG. 6M, the second passivation layer 127 is selectively etched using the fourth photosensitive layer pattern 129a as an etching mask to form a pixel electrode contact hole 131a, a common electrode contact hole 131b and a common line contact hole 131c for exposing the auxiliary electrode pattern 123c, common electrode 123a and common line 103b, respectively.

Subsequently, as illustrated in FIG. 6N, the fourth photosensitive layer pattern 129a is removed, and then a transparent conductive material is deposited at an upper portion of the second passivation layer 127 including the pixel electrode contact hole 131a, common electrode contact hole 131b and common line contact hole 131c using a sputtering method to form a second transparent conductive material layer 133. At this time, any one composition target selected from a transparent conductive material group including Indium Tin Oxide (ITO), Indium Zinc Oxide (IZO), and the like is used for the transparent conductive material.

Next, a photoresist having a high transmittance is deposited at an upper portion of the second transparent conductive material layer 133 to form a fifth photosensitive layer 135.

Subsequently, as illustrated in FIG. 6O, an exposure process is carried out on the fifth photosensitive layer 135 through a photolithography process technology using an exposure mask (not shown), and then the fifth photosensitive layer 135 is selectively removed through a development process to form a fifth photosensitive layer pattern 135a.

Next, as illustrated in FIG. 6P, the second transparent conductive material layer 133 is selectively etched using the fifth photosensitive layer pattern 135a as an etching mask to form a plurality of pixel electrodes 133a connected to the auxiliary electrode pattern 123c and separated from one another as well as the common connection pattern 133b for electrically connecting the common electrode 123a and common line 103b through the common electrode 131b and common line contact hole 131c at the same time. At this time, the pixel electrode 133a is connected to the auxiliary electrode pattern 123c and thus as a result, electrically connected to the drain electrode 113c.

Subsequently, though not shown in the drawing, the remaining fifth photosensitive layer pattern 135a is removed, and then a process of forming an alignment layer (not shown) on an entire surface of the substrate is additionally carried out, thereby completing a fabrication process of an array substrate for a fringe field switching (FFS) mode liquid crystal display device according to the present invention.

Then, as illustrated in FIG. 6Q, a black matrix 143 for blocking light is formed on the upper substrate 141 corresponding to a region excluding the pixel region in which the gate line 103 and data line 113a are crossed with each other.

Next, a color filter layer 145 including a red color filter layer (not shown), a green color filter layer (not shown) and a blue color filter layer (not shown) is formed between the black matrices 143. Here, the color filter layer 145 may be applied with a Color filter On TFT (COT) structure formed on the insulating substrate 101 instead of the upper substrate 141. In other words, the color filter layer 145 may be formed in the pixel region of the insulating substrate 101 in which the gate line 103 and data line 113a are crossed with each other in the process prior to forming the first passivation layer 116.

Subsequently, a column spacer 147 is formed at an upper portion of the color filter layer 145 to maintain a predetermined cell gap of the liquid crystal display device. Here, the column spacer 147 may be formed at an upper portion of the insulating substrate 101.

Accordingly, in case of the present invention, the drain contact hole that has been formed in the prior art is removed, and thus the area of a region in which the drain contact hole is removed may be used for an opening region, thereby enhancing the transmittance to the extent.

Next, a process of forming an alignment layer (not shown) on an entire surface of the upper substrate 141 is added thereto to complete the process of fabricating a color filter array substrate.

Then, a liquid crystal layer 151 is formed between the insulating substrate 101 and upper substrate 141, thereby completing the process of fabricating a fringe field switching (FFS) mode liquid crystal display device according to the present invention.

As described above, according to an array substrate for a fringe field switching (FFS) mode liquid crystal display device and a method for fabricating the same in accordance with the present invention, a drain contact hole in the related art that has been formed to electrically connect a drain electrode to a pixel electrode is removed, and an opening portion for exposing an upper portion of the thin-film transistor is formed on an organic insulating layer such that the exposed thin-film transistor and the pixel electrode are electrically connected to each other in a direct manner, and thus an area that has been used to form a drain contact hole in the related art can be used for an opening area, thereby enhancing the transmittance compared to the related art.

Furthermore, according to an array substrate for a fringe field switching (FFS) mode liquid crystal display device and a method for fabricating the same in accordance with the present invention, a contact hole through which the drain electrode and pixel electrode are electrically connected to each other is formed within the opening portion provided at an upper portion of the thin-film transistor, and thus an area of the drain contact hole can be reduced, thereby increasing the aperture ratio.

Accordingly, it has a structure in which the pixel electrode is disposed at the uppermost portion, thereby reducing CT and horizontal line due to capacitance between the data line and pixel electrode.

In addition, according to an array substrate for a fringe field switching (FFS) mode liquid crystal display device and a method for fabricating the same in accordance with the present invention, an amorphous silicon layer (n+ or p+) and an amorphous silicon layer (a-Si:H) containing foreign substances below a conductive layer portion corresponding to the source electrode and drain electrode and the data line are simultaneously patterned, thereby removing a trouble of causing an active tail.

Although the preferred embodiments of the present invention have been described in detail, it should be understood by those skilled in the art that various modifications and other equivalent embodiments thereof can be made.

Consequently, the rights scope of the present invention is not limited to the embodiments and various modifications and improvements thereto made by those skilled in the art using the basic concept of the present invention as defined in the accompanying claims will fall in the rights scope of the invention.

What is claimed is:

1. An array substrate for a liquid crystal display device, the array substrate comprising:
    a gate line in one direction on a surface of the substrate and a gate electrode extended from the gate line;
    a data line crossed with the gate line;
    a thin-film transistor at an intersection of the gate line and the data line;
    an organic insulating layer on an entire surface of the substrate including the thin-film transistor, and having an opening portion for exposing an active layer, a source electrode and a drain electrode above the gate electrode of the thin-film transistor;
    a common electrode having a large area at an upper portion of the organic insulating layer;
    an auxiliary electrode pattern connected to the drain electrode of the thin-film transistor through the opening portion;
    a passivation layer on the entire surface of the substrate including the common electrode and the auxiliary electrode pattern to expose the auxiliary electrode pattern connected to the thin-film transistor; and
    a plurality of pixel electrodes at an upper portion of the passivation layer, and electrically connected to the thin-film transistor through the exposed auxiliary electrode pattern, and overlapped with the common electrode.

2. The array substrate of claim 1, wherein one of the plurality of the opening portions is overlapped with an upper portion of the thin-film transistor, and formed within the organic insulation layer.

3. The array substrate of claim 1, wherein the pixel electrode is electrically connected to the drain electrode through the auxiliary electrode pattern.

4. The array substrate of claim 1, further comprising:
    a common line disposed in parallel with the gate line on the substrate.

5. The array substrate of claim 4, further comprising:
    a common connection pattern at the upper portion of the passivation layer to connect the common line and common electrode, respectively.

6. The array substrate of claim 1, further comprising:
    a color filter substrate disposed on the array substrate;
    a color filter layer at a pixel region in which the gate line and data line are crossed with each other; and
    a black matrix disposed on the color filter substrate corresponding to the opening portion including the gate line and the data line excluding the pixel region.

7. An array substrate for a liquid crystal display device, the array substrate comprising:
    a gate line in one direction on a surface of the substrate and a gate electrode extended from the gate line;
    a data line crossed with the gate line to define a pixel region;
    a thin-film transistor at an intersection of the gate line and the data line;
    an organic insulating layer on an entire surface of the substrate including the thin-film transistor, and having an opening portion for exposing a source electrode, an active layer and a drain electrode above a gate electrode of the thin-film transistor;
    a common electrode having a large area at an upper portion of the organic insulating layer;
    an auxiliary electrode pattern connected to the drain electrode of the thin-film transistor through the opening portion;
    a passivation layer on the entire surface of the substrate including the common electrode and the auxiliary electrode pattern to expose the auxiliary electrode pattern connected to the thin-film transistor;
    a plurality of pixel electrodes at an upper portion of the passivation layer, and electrically connected to the thin-film transistor through the exposed auxiliary electrode pattern, and overlapped with the common electrode;
    a color filter substrate disposed on the array substrate;

a color filter layer at a pixel region in which the gate line and data line are crossed with each other; and a black matrix disposed on the color filter substrate corresponding to the opening portion including the gate line and the data line excluding the pixel region.

8. The array substrate of claim 7, wherein the opening portion is overlapped with an upper portion of the thin-film transistor, and formed within the organic insulation layer.

9. The array substrate of claim 7, wherein the pixel electrode is electrically connected to the drain electrode through the auxiliary electrode pattern.

10. The array substrate of claim 7, further comprising:
a common line disposed in parallel with the gate line on the substrate.

11. The array substrate of claim 10, further comprising:
a common connection pattern at the upper portion of the passivation layer to connect the common line and common electrode, respectively.

* * * * *